(12) United States Patent  
Motomuro

(10) Patent No.: US 7,900,348 B2  
(45) Date of Patent: Mar. 8, 2011

(54) METHOD OF MANUFACTURING AN ELECTRONIC COMPONENT SUBSTRATE

(75) Inventor: Hiroshi Motomuro, Kanagawa (JP)

(73) Assignee: Sony Corporation, Tokyo (JP)

( * ) Notice: Subject to any disclaimer, the term of this patent is extended or adjusted under 35 U.S.C. 154(b) by 140 days.

(21) Appl. No.: 12/242,376

(22) Filed: Sep. 30, 2008

(65) Prior Publication Data

US 2009/0090002 A1      Apr. 9, 2009

(30) Foreign Application Priority Data

Oct. 5, 2007   (JP) ................................ 2007-261585

(51) Int. Cl.  
*H05K 3/30*      (2006.01)

(52) U.S. Cl. .................... 29/832; 29/825; 29/840; 445/2

(58) Field of Classification Search .................... 29/825, 29/830, 832, 840; 445/2  
See application file for complete search history.

(56) References Cited

U.S. PATENT DOCUMENTS

| | | | | |
|---|---|---|---|---|
| 6,060,339 | A * | 5/2000 | Akram et al. ................. | 438/108 |
| 6,238,942 | B1 * | 5/2001 | Farnworth ...................... | 438/15 |
| 6,720,652 | B2 * | 4/2004 | Akram et al. ................. | 257/723 |
| 6,728,023 | B1 * | 4/2004 | Alioshin et al. ............. | 359/290 |
| 6,730,526 | B2 * | 5/2004 | Akram et al. ................. | 438/4 |
| 7,102,673 | B2 * | 9/2006 | Kimura ......................... | 348/246 |
| 7,166,915 | B2 * | 1/2007 | Akram et al. ................. | 257/723 |
| 7,211,452 | B2 * | 5/2007 | Cok et al. ...................... | 438/16 |
| 7,417,676 | B2 * | 8/2008 | Kimura ......................... | 348/246 |
| 2002/0122123 | A1 * | 9/2002 | Kimura ......................... | 348/246 |
| 2005/0233504 | A1 | 10/2005 | Doi et al. | |
| 2006/0063281 | A1 * | 3/2006 | Cok et al. ........................ | 438/14 |
| 2006/0276096 | A1 * | 12/2006 | Wang et al. ...................... | 445/2 |
| 2008/0254701 | A1 * | 10/2008 | Koshiishi et al. ................ | 445/2 |

FOREIGN PATENT DOCUMENTS

| | | |
|---|---|---|
| JP | 04-324999 | 11/1992 |
| JP | 07-288343 | 10/1995 |
| JP | 09-064420 | 3/1997 |
| JP | 10-284759 | 10/1998 |
| JP | 2002-261335 | 9/2002 |
| JP | 2002-353695 | 12/2002 |
| JP | 2003-162229 | 6/2003 |
| JP | 2004-128400 | 4/2004 |
| JP | 2004-273596 | 9/2004 |
| JP | 2004-281630 | 10/2004 |
| JP | 2006-339464 | 12/2006 |

OTHER PUBLICATIONS

Japanese Office Action issued on Jul. 14, 2009, for corresponding Japanese Patent Application 2007-261585.

* cited by examiner

*Primary Examiner* — C. J Arbes  
(74) *Attorney, Agent, or Firm* — K&L Gates LLP

(57) ABSTRACT

A method of manufacturing an electronic component substrate is provided, the method allowing manufacturing yield to be improved. The method of manufacturing an electronic component substrate in which a plurality of electronic components are mounted on a first substrate includes the steps of: aligning and disposing the plurality of electronic components on a second substrate; transferring the electronic components on the second substrate onto the first substrate; detecting an electronic component un-mounted portion on the first substrate; and repairing by selectively re-transferring the electronic component from the second substrate onto the detected un-mounted portion on the first substrate.

13 Claims, 16 Drawing Sheets

METHOD OF MANUFACTURING AN ELECTRONIC COMPONENT SUBSTRATE

CROSS REFERENCES TO RELATED APPLICATIONS

The present application claims priority to Japanese Patent Application JP 2007-261585 filed in the Japanese Patent Office on Oct. 5, 2007, the entire contents of which being incorporated herein by reference.

BACKGROUND

The present application relates to a method of manufacturing an electronic component substrate formed by transferring an electronic component, such as a light emitting diode (LED), onto a substrate.

Since the past, a process for manufacturing an LED display is known in which an LED substrate is formed through the use of a transfer technique (refer to, for example, Japanese Unexamined Patent Application Publication Nos. 2004-273596 and 2004-281630). Specifically, after a plurality of LEDs are aligned and disposed in advance on an element-mounted substrate (transfer substrate), the LEDs on the element-mounted substrate are collectively mounted on a mounting substrate (a substrate serving as a base on which the LED substrate is formed). As a result, a large number of LEDs are able to be quickly mounted, and manufacturing efficiency is improved.

SUMMARY

However, in a method such that the LEDs are collectively mounted through the use of a transfer technique, it is difficult to uniformly transfer and mount the LEDs on a display area. Therefore, a defective pixel appears on the LED display because of a defective section (an LED un-mounted portion) being formed during transfer. As a result, manufacturing yield decreases.

Issues such as this are not limited to manufacture a light emitting device substrate (such as the above-described LED substrate) in which a plurality of light emitting devices, such as the LED, are aligned and mounted on the substrate. The issues also arise when manufacturing an electronic component substrate in which a plurality of electronic components are mounted on the substrate.

In view of the foregoing, it is desirable to provide a method of manufacturing an electronic component substrate, the method allowing manufacturing yield to be improved.

According to an embodiment, there is provided a method of manufacturing an electronic component including the steps of: aligning and disposing a plurality of electronic components on a second substrate; transferring the electronic components on the second substrate onto a first substrate; detecting an electronic component un-mounted portion on the first substrate; and repairing by selectively re-transferring the electronic component from the second substrate onto the detected un-mounted portion on the first substrate.

In the method of manufacturing an electronic component substrate of the embodiment, after the plurality of electronic components is aligned and disposed on the second substrate, the electronic components on the second substrate are transferred onto the first substrate. At this time, an un-mounted portion of electronic component on the first substrate is detected. An electronic component is selectively re-transferred from the second substrate onto the detected un-mounted portion on the first substrate. As a result, the un-mounted portion is selectively repaired.

In the method of manufacturing an electronic component substrate of the embodiment, before transferring, the un-mounted portion may be indirectly detected by a deficient portion on the second substrate being detected, the deficient portion being a portion at which the electronic component is not originally disposed. Alternatively, after transferring step, the un-mounted portion may be indirectly detected by a mounting defect portion on the second substrate being detected, the mounting defect portion being a portion at which the electronic component remains without being transferred. Alternatively, after transferring step, the un-mounted portion on the first substrate may be directly detected. Moreover, the un-mounted portion on the first substrate may be detected by a combination of two types of methods or more, among the three types of methods. When two types of methods or more are combined in this way, detection accuracy of the un-mounted portion is improved.

According to the method of manufacturing an electronic component substrate of the embodiment, the electronic component un-mounted portion on the first substrate is selectively repaired by the un-mounted portion being detected and a electronic component being selectively re-transferred from the second substrate onto the un-mounted portion, the un-mounted portion being formed when the electronic components are transferred from the second substrate to the first substrate. Therefore, yield obtained when the electronic component substrate is manufactured is improved.

Additional features and advantages are described herein, and will be apparent from the following Detailed Description and the figures.

DETAILED DESCRIPTION

An embodiment will be hereinafter described in detail with reference to the drawings.

Figure 1:
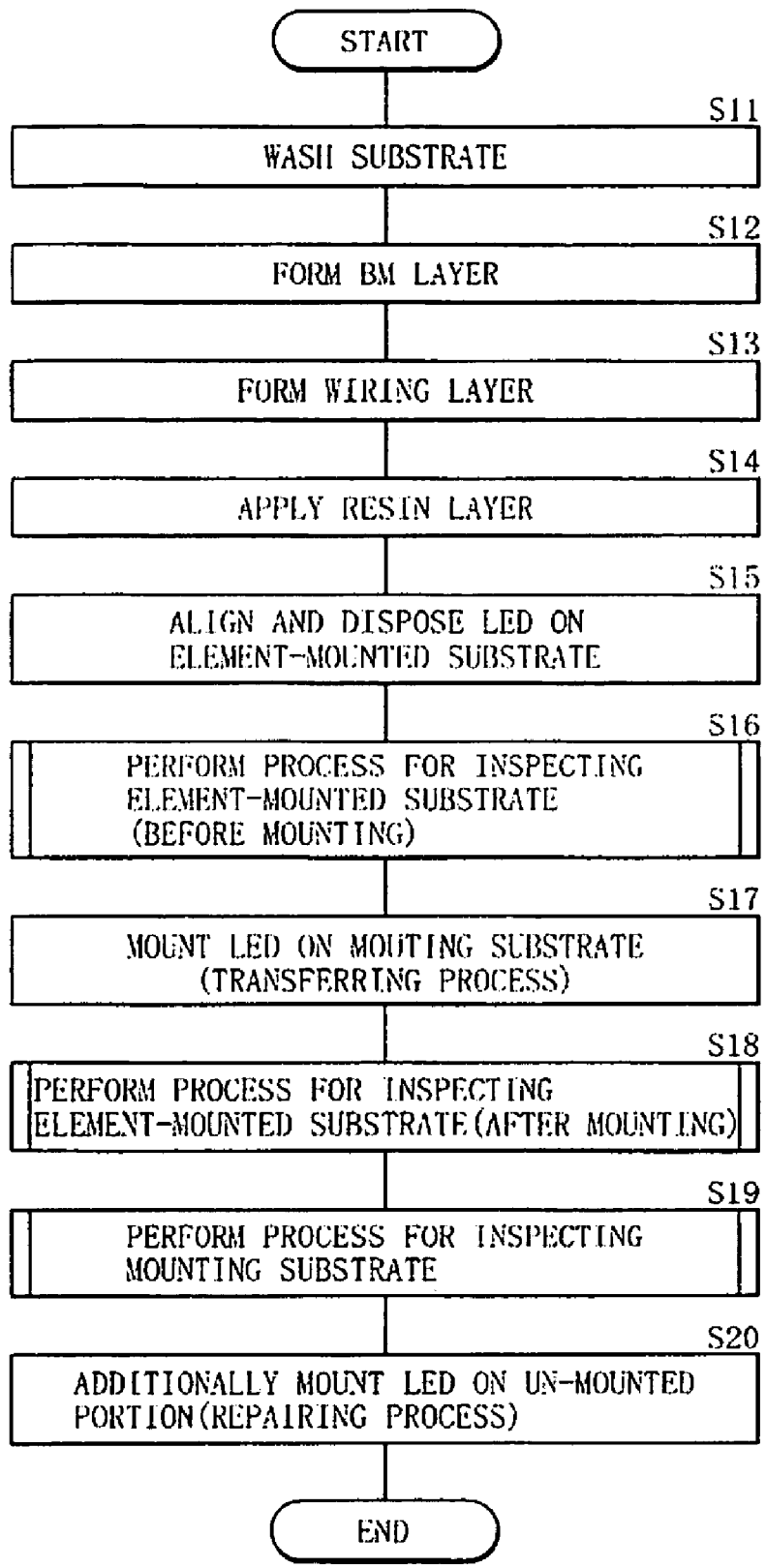
FIG. 1 is a flowchart of main processes performed in a method of manufacturing an electronic component substrate according to an embodiment.

FIG. 1 shows a flowchart of main processes performed in a method of manufacturing an electronic component substrate (a method of manufacturing an LED substrate 5, described hereinafter) according to an embodiment.

Figure 2:
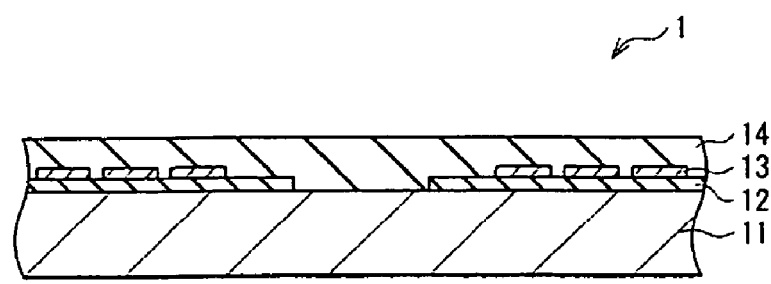
FIG. 2 is a cross-sectional view explaining processes performed up to a process for forming a resin layer, in the processes shown in FIG. 1.

First, as shown in FIG. 2, for example, a mounting substrate 1 (first substrate) on which LEDs are mounted is formed by a black matrix (BM) layer 12, a wiring layer 13, and a resin layer 14 being sequentially formed on a substrate 11 (Steps S11 to S14). The substrate 11 is made of glass, plastic, and the like. Specifically, the substrate 11 is first washed (Step S11). Then, the BM layer 12 is formed on the substrate 11 through the use of, for example, a photolithography method, a printing method, or a film-lamination method (Step S12). Next, the wiring layer 13 is formed on the BM layer 12 through the use of, for example, a photolithography method, a sputtering method, a printing method, a film-lamination method, or a plating method (Step S13). The wiring layer 13 is coated with the resin layer 14 through the use of, for example, a spin-coating method, a slit method, a spraying method, or an ink-jet method (Step S14). The BM layer 12 is formed of, for example, a resin that is a mixture of non-conductive materials having extremely low light transmittance. The wiring layer 13 is formed of, for example, a conductive metal film. The resin layer 14 is formed of, for example, an ultraviolet (UV) curing adhesive or a thermosetting adhesive.

Figure 3:
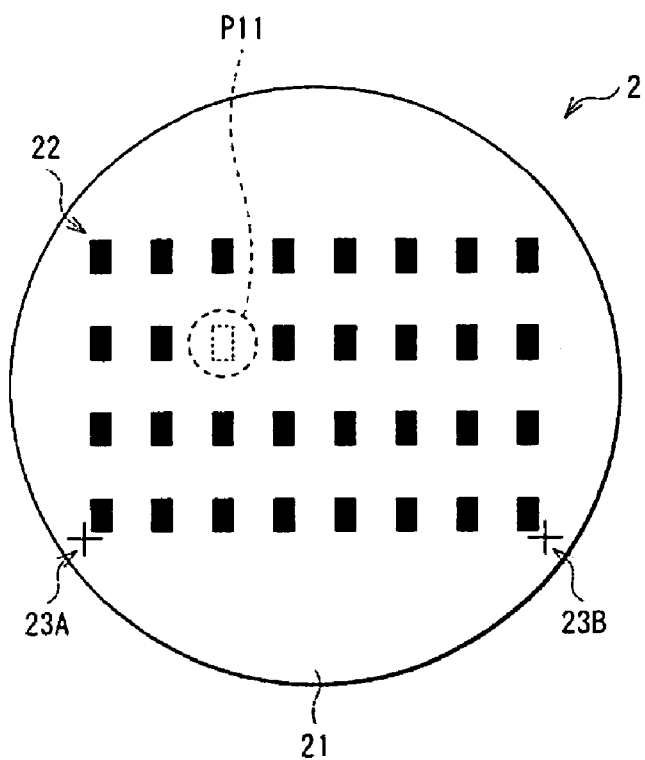
FIG. 3 is a plan view of a configuration example of an element-mounted substrate.

Next, as shown in FIG. 3, for example, an element-mounted substrate 2 is formed by a plurality of LEDs 22 being arranged to form a matrix and disposed on a substrate 21 (second substrate) (Step S15). The substrate 21 is made of a material such as glass, plastic, or metal. The LEDs 22 are transfer subjects of a transferring process described hereinafter. A pair of reference positions 23A and 23B are formed on the substrate 21 of the element-mounted substrate 2. The reference positions 23A and 23B serve as alignment markers used in the transferring process described hereinafter. A deficient portion P11 may be formed on the substrate 21, as shown in FIG. 3, because an LED 22 serving as a transfer subject is not disposed on the element-mounted substrate 2 in Step S15. The deficient portion P11 is a section on the substrate 21 in which the LED 22 is originally not disposed. Such a deficient portion P11 ultimately becomes an un-mounted portion of LED 22 on an LED substrate described hereinafter.

Figure 4:
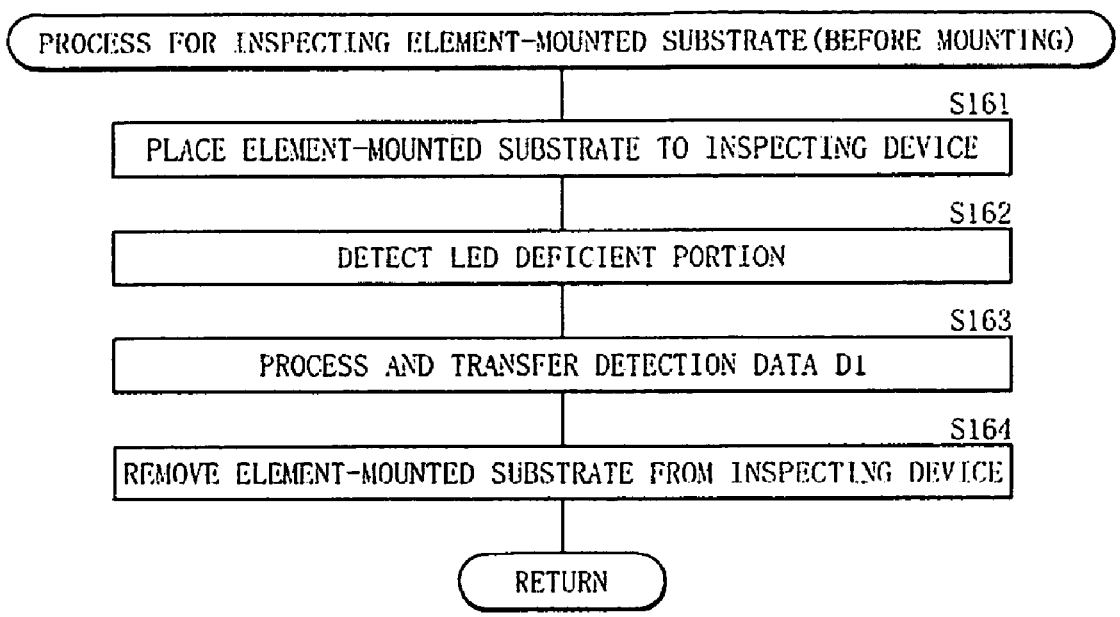
FIG. 4 is a flowchart of details of a process for inspecting the element-mounted substrate (before mounting) shown in FIG. 1.

Therefore, next, an inspecting process for inspecting the element-mounted substrate 2 (before mounting) is performed before the transferring process for transferring the LEDs 22 (Step S16). The un-mounted portion of LED 22 is indirectly detected as a result of the deficient portion P11 on the element-mounted substrate 2 being detected by the inspecting process. Specifically, as shown in FIG. 4, for example, first, the element-mounted substrate 2 is placed to an inspecting device (detector) (not shown) (Step S161). In this state, the deficient portion P11 of LED 22 is detected, and detection data D1 including X and Y coordinates, and the like is acquired (Step S162).

Figure 5A:
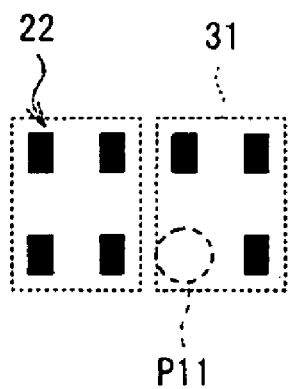
FIGS. 5A and 5B are planar schematic diagrams explaining an example of a method of detecting a deficient portion in the process shown in FIG. 4.
Figure 5B:
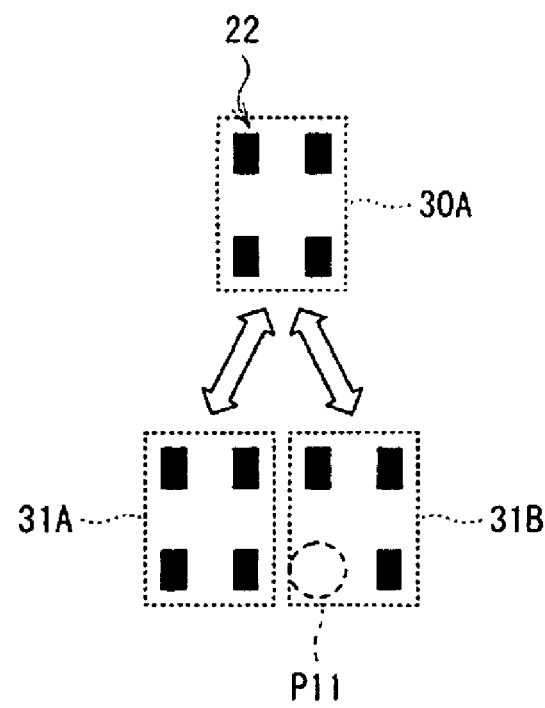

At this time, the LEDs 22 on the element-mounted substrate 2 are imaged by a charge-coupled device (CCD) or the like, and image data is acquired, as a result of a pattern inspection such as those shown in FIG. 5A and FIG. 5B. The deficient portion P11 on the element-mounted substrate 2 is then detected. Specifically, as shown in FIG. 5A, for example, the deficient portion P11 is detected by comparing image data of a certain unit area (unit image data 31) within an area adjacent to the unit image data 31 (such as to the left or right), and detecting differences. Alternatively, as shown in FIG. 5B for example, the deficient portion P11 is detected by comparing a predetermined registered pattern 30A with unit image data 31A, 31B, and the like, which is acquired through imaging, and detecting differences.

Figure 6:
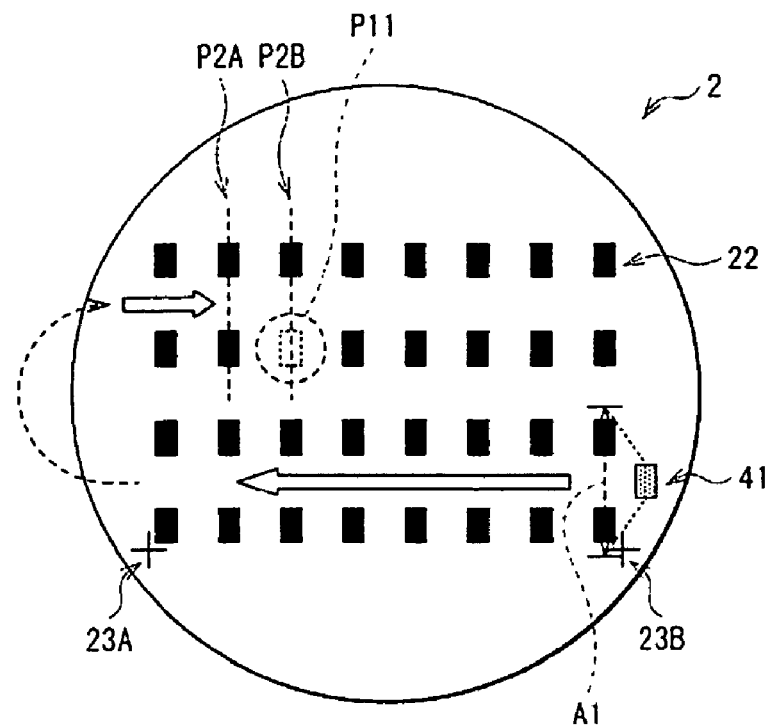
FIG. 6 is a plan view explaining another example of the method of detecting a deficient portion in the process shown in FIG. 4.
Figure 7A:
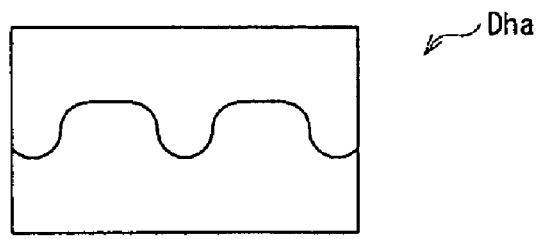
FIGS. 7A and 7B are characteristic views of an example of displacement data acquired through the detecting method shown in FIG. 6.
Figure 7B:
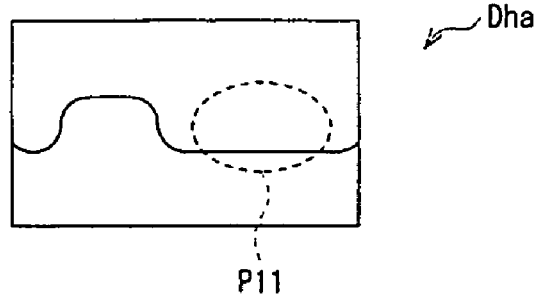

Alternatively, the deficient portion P11 on the element-mounted substrate 2 may be detected as shown in FIG. 6, for example. That is, a displacement meter 41 (for example a laser-type) having a predetermined detection range A1 is scanned on the element-mounted substrate 2 to inspect the displacement of a front surface of the element-mounted substrate 2, thereby acquiring displacement data Dh. Specifically, displacement data Dha and Dhb as shown in FIG. 7A and FIG. 7B, are able to be acquired, respectively, for example, at points P2A and P2B in FIG. 6. Therefore, the deficient portion P11 is detected by differences in displacement on the surface of the element-mounted substrate 2 being detected.

Subsequently, a predetermined processing operation is performed on the detection data D1 acquired in Step S162, and the processed detection data is transferred to a transferring device used in a repairing process, described hereinafter (Step S163). The element-mounted substrate 2 is then removed from the inspecting device (Step S164). The inspecting process for inspecting the element-mounted substrate 2 (before mounting) is thereby finished.

Figure 8:
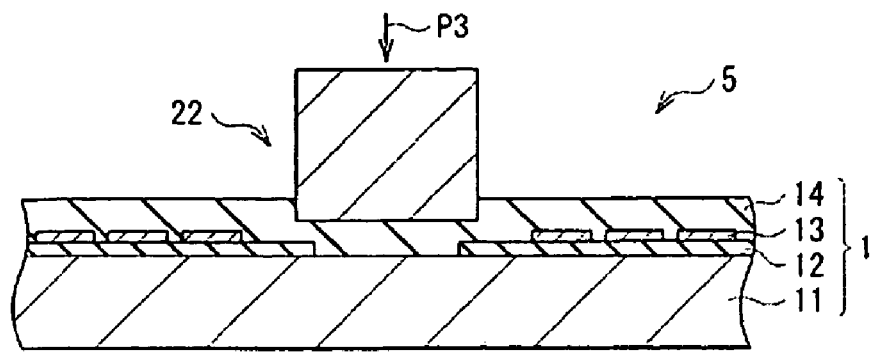
FIG. 8 is a cross-sectional view explaining a process for transferring LED shown in FIG. 1.
Figure 9:
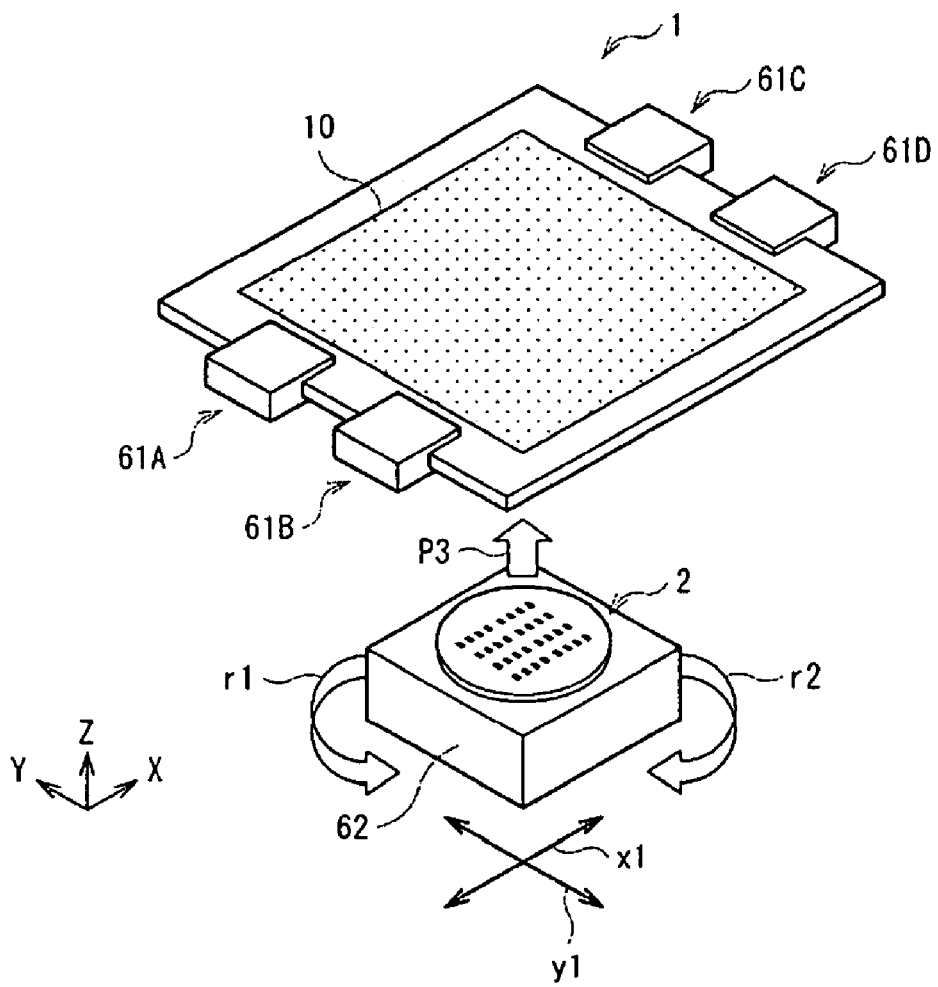
FIG. 9 is a perspective view of a configuration example of a device used in the transferring process shown in FIG. 8.
Figure 10:
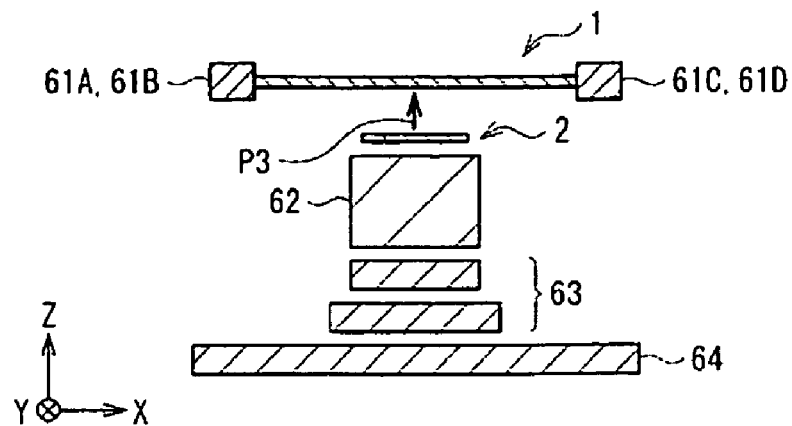
FIG. 10 is a cross-sectional view of the configuration example of the device used in the transferring process shown in FIG. 8.

Next, as shown by an arrow P3 in FIG. 8, for example, the LEDs 22 are mounted on the mounting substrate 1 by the transfer device as shown in FIG. 9 and FIG. 10, transferring the LEDs 22 on the element-mounted substrate 2 onto the resin layer 14 in the mounting substrate 1. Thereby, the LED substrate 5 is formed (Step S17 in FIG. 1: transferring process). Specifically, the mounting substrate 1 is held by holding portions 61A to 61D. The element-mounted substrate 2 is held by a holding portion 62. The mounting substrate 1 and the element-mounted substrate 2 are disposed facing each other such that the mounting substrate 1 and the LED 22 on the element-mounted substrate 2 face each other. Then, as indicated by reference numbers x1, y1, r1, and r2 in FIG. 9, an X/Y/θ stage 63 and a supporting portion 64, shown in FIG. 10, align the element-mounted substrate 2 at a predetermined position on X, Y, and Z axes. The LEDs 22 on the element-mounted substrate 2 are transferred onto the mounting substrate 1 by pressing the LED 22 against the mounting substrate 1, as indicated by an arrow P3.

Figure 11:
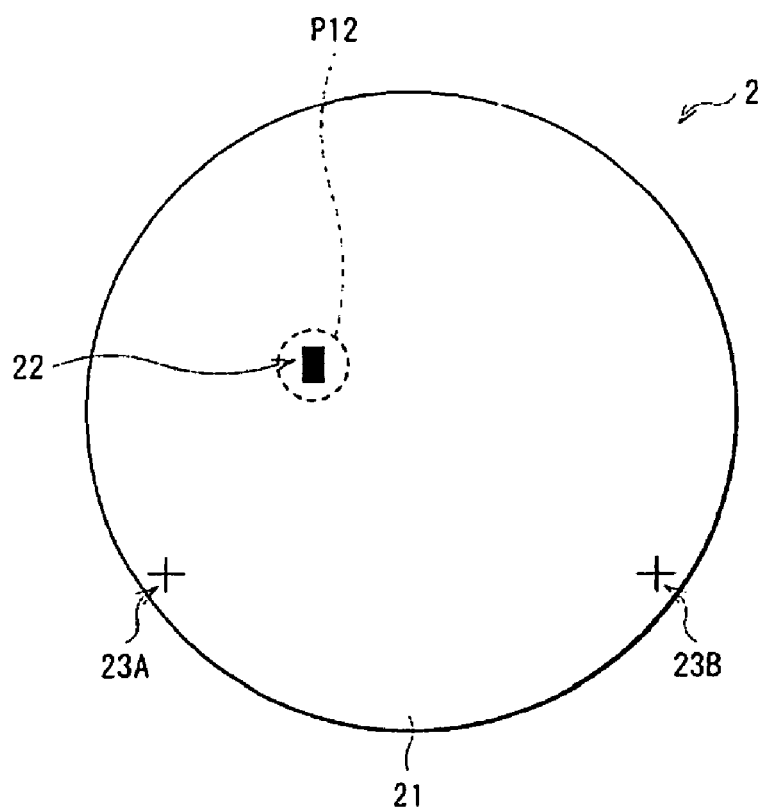
FIG. 11 is a plan view of an example of a mounting defect portion on the element-mounted substrate.

However, at this time, as shown in FIG. 11, for example, a mounting defect portion P12 may be occur on the element-mounted substrate 2 because an LED 22 that is a transfer subject is not transferred in Step S17. The mounting defect portion P12 is a portion on the substrate 21 in which the LED 22 remains. Such a mounting defect portion P12 ultimately becomes an un-mounted portion of LED 22 on the LED substrate 5.

Figure 12:
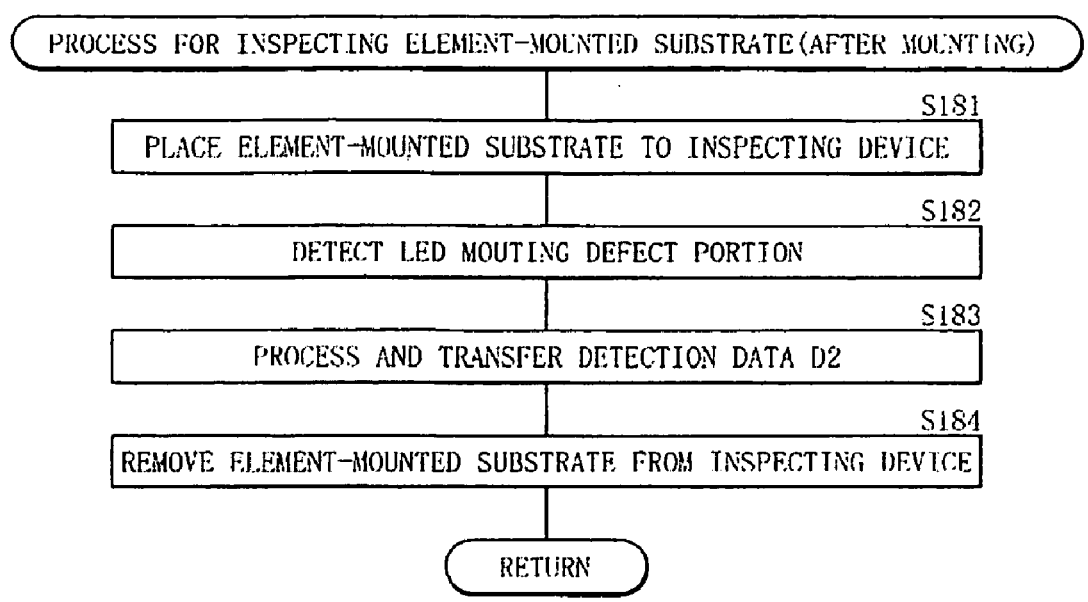
FIG. 12 is a flowchart of details of a process for inspecting the element-mounted substrate (after mounting) shown in FIG. 1.

Therefore, next, an inspecting process for inspecting the element-mounted substrate 2 (after mounting) is performed (Step S18). The un-mounted portion of LED 22 is indirectly detected as a result of the mounting defect portion P12 on the element-mounted substrate 2 being detected by the inspecting process. Specifically, as shown in FIG. 12, for example, first, the element-mounted substrate 2 is placed to the inspecting device (detector) (not shown) (Step S181). In this state, the mounting defect portion P12 of LED 22 is detected, and detection data D2 including X and Y coordinates, and the like is acquired (Step S182).

Figure 13A:
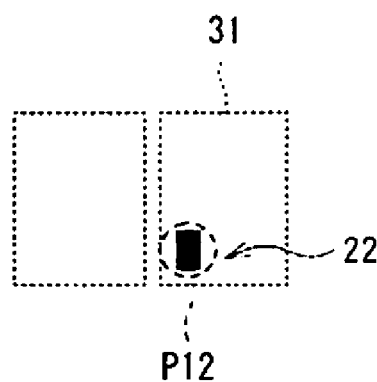
FIGS. 13A and 13B are planar schematic diagrams explaining an example of a method of detecting the mounting defect portion in the process shown in FIG. 12.
Figure 13B:
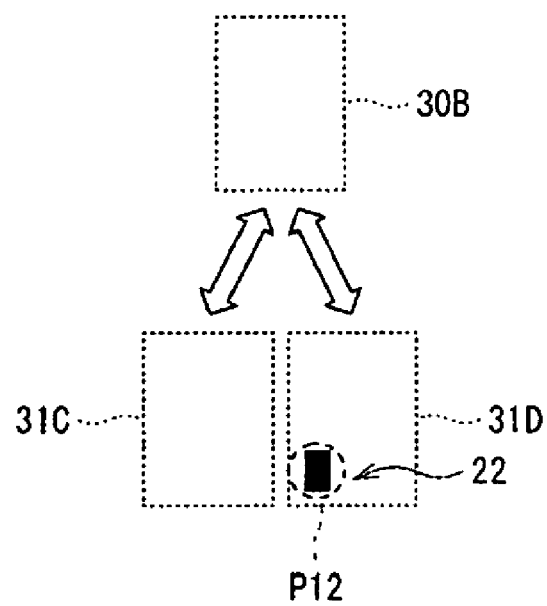

At this time, the LEDs 22 on the element-mounted substrate 2 are imaged by the CCD or the like, and image data is acquired, as a result of a pattern inspection as shown in FIG. 13A and FIG. 13B. Thus, the mounting defect portion P12 on the element-mounted substrate 2 is detected. Specifically, as shown in FIG. 13A, for example, the mounting defect portion P12 is detected by comparing the unit image data 31 within an area adjacent to the unit image data 31 (such as to the left or right), and detecting differences. Alternatively, as shown in FIG. 13B for example, the mounting defect portion P12 is detected by comparing a predetermined registered pattern 30B with unit image data 31C, 31D, and the like, and detecting differences. The unit image data 31C and 31D are acquired through imaging.

Figure 14:
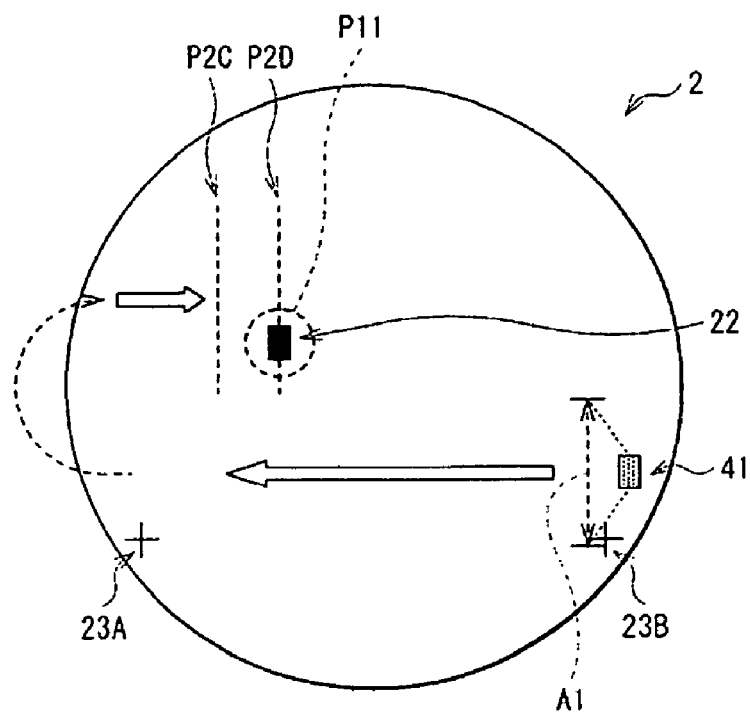
FIG. 14 is a plan view explaining another example of the method of detecting the mounting defect portion in the process shown in FIG. 12.
Figure 15A:
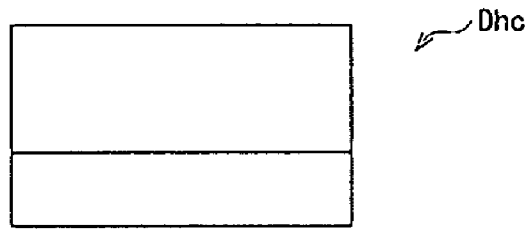
FIGS. 15A and 15B are characteristic views of an example of displacement data acquired during the detecting method shown in FIG. 14.
Figure 15B:
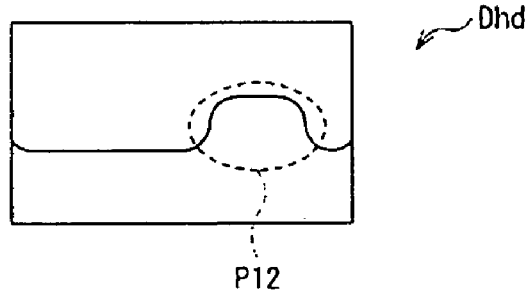

Alternatively, the mounting defect portion P12 on the element-mounted substrate 2 may be detected as shown in FIG. 14, for example. That is, the displacement meter 41 (for example, a laser-type) having a predetermined detection range A1 is scanned on the element-mounted substrate 2 to inspect displacement on the front surface of the element-mounted substrate 2, thereby acquiring the displacement data Dh. Specifically, displacement data Dhc and Dhd as shown in FIG. 15A and FIG. 15B are able to be acquired, respectively, for example, at points P2C and P2D in FIG. 14. Therefore, the mounting defect portion P12 is detected by differences in displacement on the surface of the element-mounted substrate 2 being detected.

Subsequently, a predetermined processing operation is performed on the detection data D2 acquired in Step S182, and the processed detection data is transferred to the transferring device used in the repairing process, described hereinafter (Step S183). The element-mounted substrate 2 is then removed from the inspecting device (Step S184). The inspecting process for inspecting the element-mounted substrate 2 (after mounting) is thereby finished.

Figure 16:
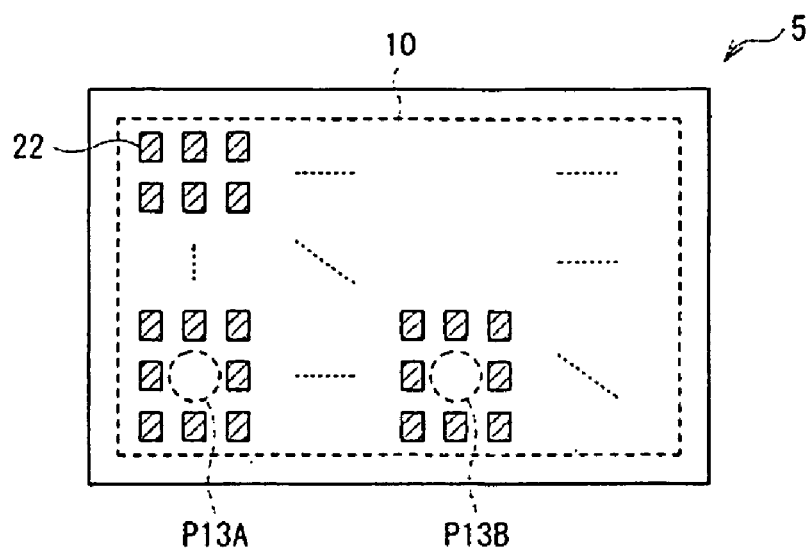
FIG. 16 is a plan view of an example of an un-mounted portion on an LED substrate.
Figure 17A:
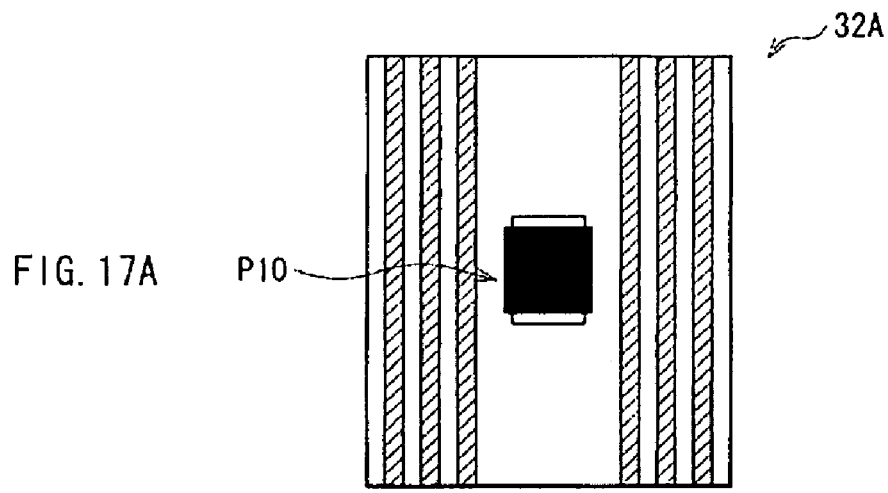
FIGS. 17A and 17B are planar schematic diagrams explaining an overview of a method of discriminating between a mounted portion and an un-mounted portion using image data.
Figure 17B:
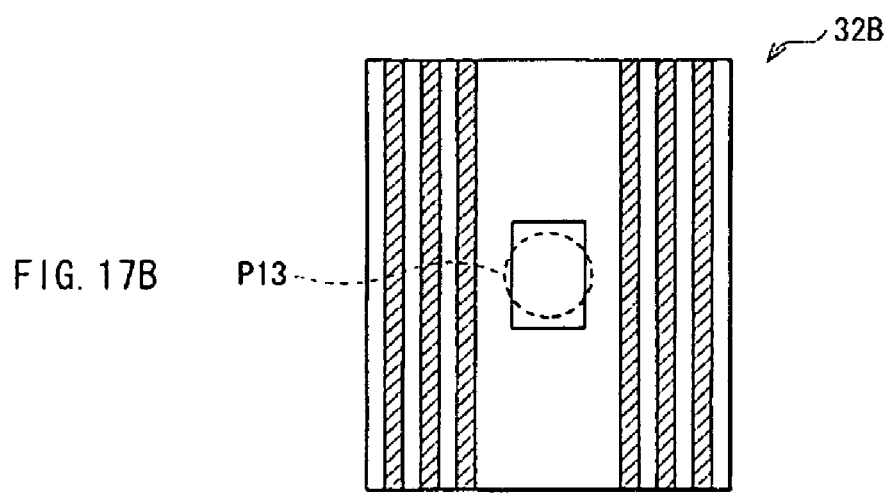

Next, an inspecting process of the LED substrate 5 including the mounting substrate 1 is performed (Step S19 in FIG. 1). In the inspecting process, un-mounted portions P13A and P13B of LED 22 in a display area 10 on the LED substrate 5, as shown in FIG. 16, are directly detected. The un-mounted portions P13A and P13B of LED 22 are detected by the LED 22 on the LED substrate 5 being imaged, and image data 32A, 32B, and the like being acquired, as shown in FIG. 17A and FIG. 17B, for example. Specifically, light transmittance and the like are different between a mounted portion P10 of LED 22 and an un-mounted portion P13 of LED 22. Therefore, the un-mounted portions P13 of LED 22 are directly detected by detecting such differences. Because the BM layer 12 is originally configured to have low light transmittance, it is therefore preferable that the difference in light transmittance between the LED 22 mounted portion P10 and the un-mounted portions P13 of LED 22 be made as large as possible by, for example, an outer appearance of the LEDs 22 being near black in color.

Figure 18:
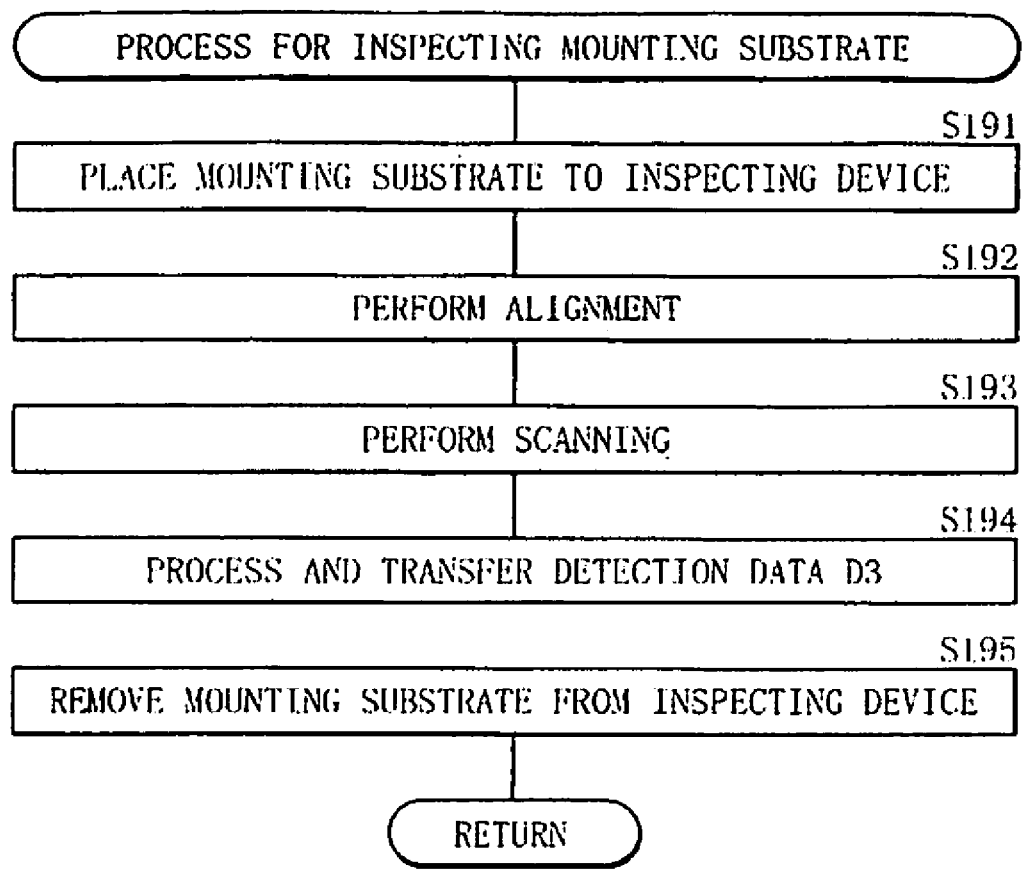
FIG. 18 is a flowchart of details of a process for inspecting a mounting substrate shown in FIG. 1.

In the inspecting process of the LED substrate 5, specifically, the LED substrate 5 is placed to the inspecting device (detector) (not shown) (Step S191 in FIG. 18) and is aligned (Step S192). In this state, the un-mounted portions P13 of LED 22 are directly detected by an imaging device, which will be described below, or the like performing a scan. Detection data D3 including X and Y coordinates, and the like is thereby acquired (Step S193).

Figure 19A:
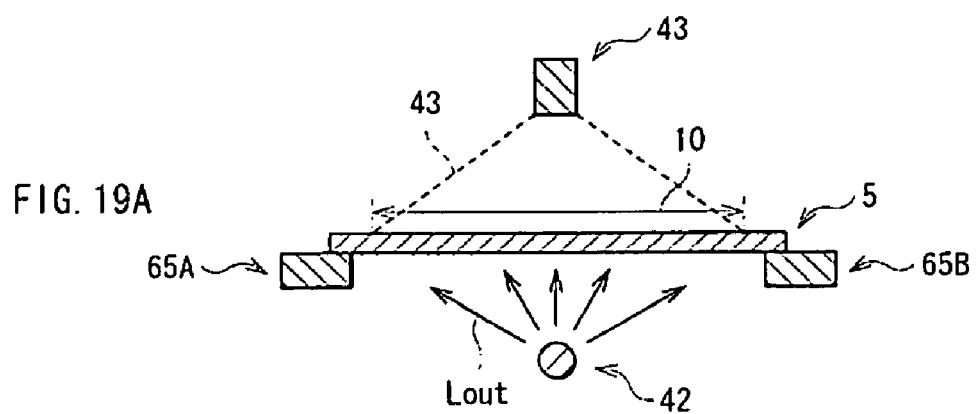
FIGS. 19A, 19B and 19C are schematic diagrams explaining an example of a method of obtaining detection data in the process shown in FIG. 18.
Figure 19B:
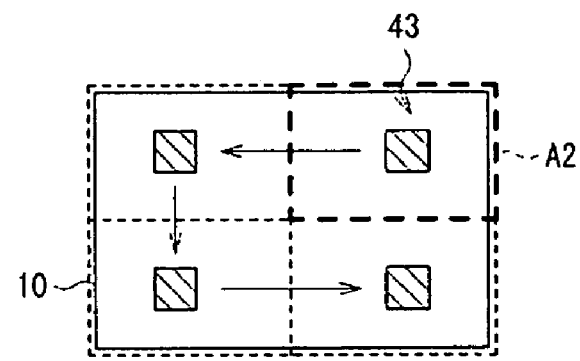
Figure 19C:
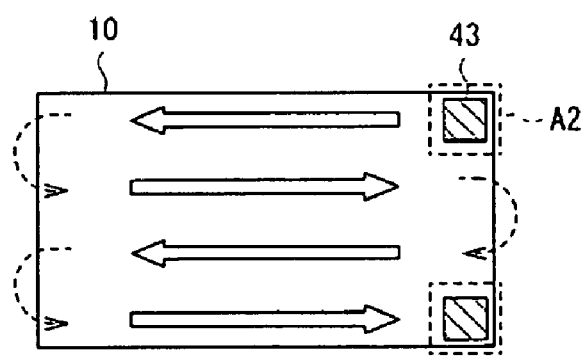

At this time, as shown in FIG. 19A to FIG. 19C, for example, the detection data D3 is acquired by the CCD, serving as the imaging device, being used on the LED substrate 5 held by holding portions 65A and 65B. The CCD uses irradiating light Lout from a light source 42. Specifically, the display area 10 may be collectively imaged, as shown in FIG. 19A. Alternatively, as shown in FIG. 19B, the display area 10 may be divided into a plurality of areas (for example, four areas) to form a plurality of imaging areas A2, and then, the imaging areas A2 are sequentially imaged. Alternatively, as shown in FIG. 19C, imaging may be performed by a CCD 43 sequentially scanning each imaging area A2. In the examples shown in FIG. 19B and FIG. 19C, the light source 42 and the CCD 43 need to be sequentially driven. However, in the case where a surface light source is used as the light source 42, sequential drive of the light source 42 is unnecessary.

Figure 20:
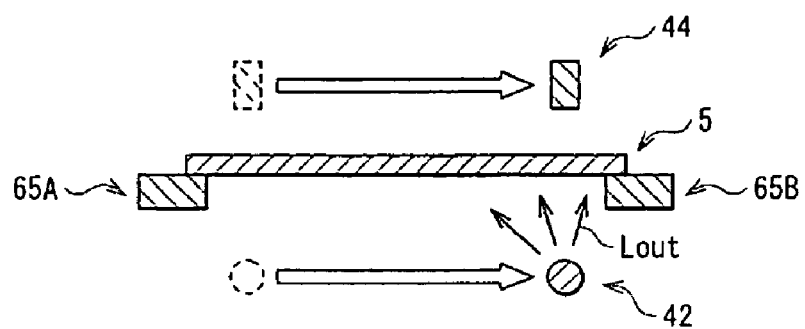
FIG. 20 is a schematic diagram explaining another example of the method of obtaining detection data in the process shown in FIG. 18.
Figure 21:
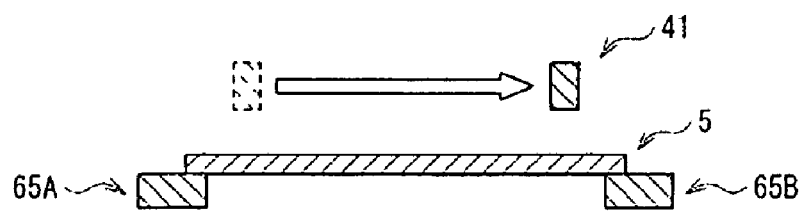
FIG. 21 is a schematic diagram explaining another example of the method of acquiring detection data in the process shown in FIG. 18.

A line sensor 44 as shown in FIG. 20 may also be used in place of the CCD 43 as the imaging device. Alternatively, as shown in FIG. 21, for example, the displacement meter 41 is used in place of the imaging device. The un-mounted portions P13 may be directly detected by the displacement meter 41 detecting a difference in height between the mounted portion P10 and the un-mounted portions P13.

Subsequently, a predetermined processing operation is performed on the detection data D3 acquired in Step S193, and the processed detection data is transferred to the transferring device used in the repairing process, described hereinafter (Step S194). The LED substrate 5 is then removed from the inspecting device (Step S195). The inspecting process for inspecting the LED substrate 5 is thereby finished.

Figure 22A:
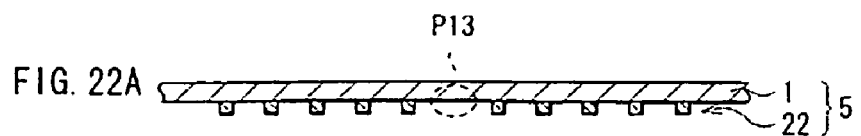
FIGS. 22A, 22B and 22C are cross-sectional views explaining details of a repairing process shown in FIG. 1.
Figure 22B:
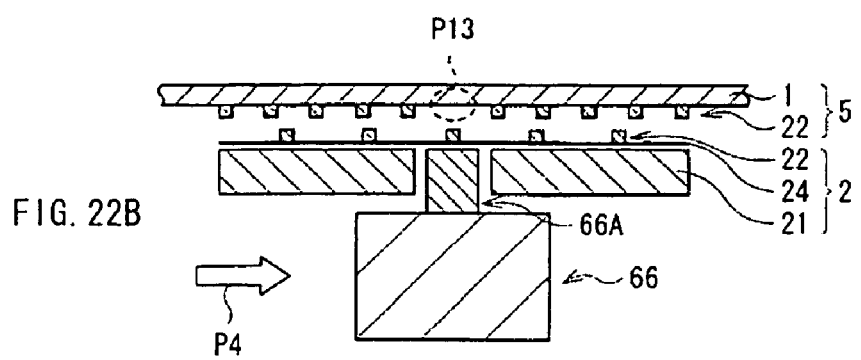
Figure 22C:
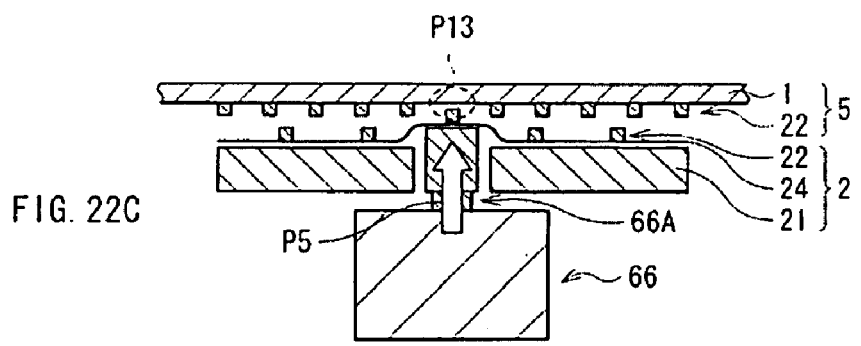

Next, as shown in FIG. 22A to FIG. 22C, for example, LEDs 22 are selectively and additionally mounted (re-transferred) from the element-mounted substrate 2 onto the un-mounted portions P13 of LED 22 on the LED substrate 5 (Step S20 in FIG. 1: repairing step). The un-mounted portions P13 of LED 22 are indirectly or directly detected in at least one of Step S16, Step S18, and Step S19.

Specifically, in the case where the un-mounted portion P13 of LED 22 appears on the LED substrate 5 as shown in FIG. 22A, for example, the LED 22 is re-transferred through the use of the transferring device as shown in FIG. 9 and FIG. 10, described above. More specifically, first, as shown in FIG. 22B, the LED substrate 5 is held by a holding portion (not shown), and the element-mounted substrate 2 is held by a holding portion (not shown). The LED substrate 5 and the element-mounted substrate 2 are disposed facing each other such that the LED 22 on the LED substrate 5 and the LED 22 on the element-mounted substrate 2 face each other. Then, based on the detection data D1 to D3 acquired in Step S16, Step S18, or Step S19, an X/Y/θ stage and a supporting portion (not shown) align a mounting mechanism 66 and a tip portion 66A at a predetermined position (a position corresponding to the un-mounted portion P13) on X, Y, and Z axes, as indicated by an arrow P4 in FIG. 22B.

Figure 23:
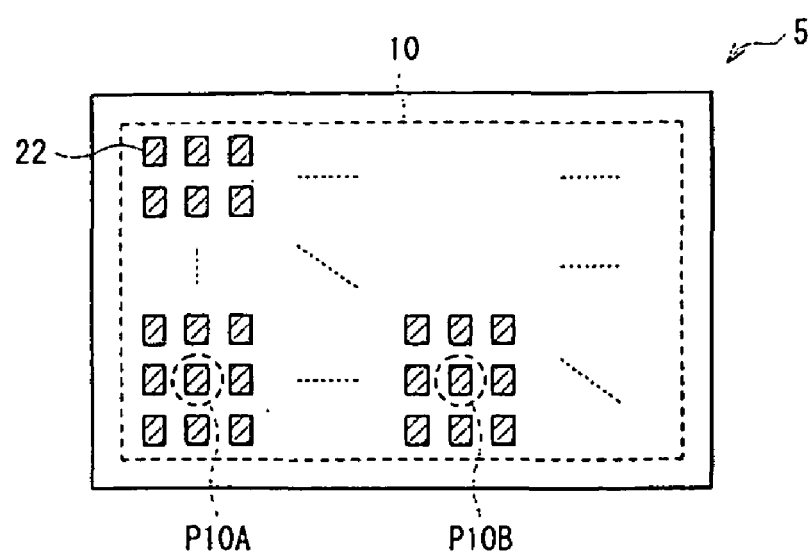
FIG. 23 is a plan view of an example of an LED substrate after the repairing process shown in FIG. 22 is performed.

Next, as shown in FIG. 22C, the mounting mechanism 66 and the tip portion 66A press the LED 22 on the element-mounted substrate 2 onto the LED substrate 5 with a resin film 24 in between. The LED 22 is re-transferred onto the LED substrate 5 as indicated by an arrow P5 in FIG. 22C. As a result, as shown in FIG. 23, for example, the un-mounted portion P13 of LED 22 in the display area 10 on the LED substrate 5 becomes the mounted portion P10. An LED substrate 5 with a defective pixel repaired is thereby fabricated.

Subsequently, a process for electrically connecting the wiring layer 13 and the LED 22, a process for including a display-drive driver and the like (not shown), and the like are performed on the LED substrate 5. As a result, an LED display including the LED substrate 5 is manufactured.

In this way, according to the embodiment, after a plurality of LEDs 22 are aligned on the element-mounted substrate 2 and disposed, the LEDs 22 on the element-mounted substrate 2 are transferred onto the mounting substrate 1. At this time, the un-mounted portion P13 of LED 22 on the mounting substrate 1 is detected. An LED 22 is selectively re-transferred from the element-mounted substrate 2 onto the detected un-mounted portion P13 on the mounting substrate 1. As a result, the un-mounted portion P13 is selectively repaired.

As described above, according to the embodiment, the un-mounted portion P13 of LED 22 on the mounting substrate 1 is detected when the LEDs 22 are transferred from the element-mounted substrate 2 onto the mounting substrate 1. In addition, the LED 22 is selectively re-transferred from the element-mounted substrate 2 onto the detected un-mounted portion P13 on the mounting substrate 1. As a result, the un-mounted portion P13 is selectively repaired. Therefore, yield when manufacturing the LED substrate 5 is improved.

Specifically, in the repairing process, the LED substrate 5 and the element-mounted substrate 2 are disposed facing each other such that the LEDs 22 on the LED substrate 5 and the LEDs 22 on the element-mounted substrate 2 face each other. Then, based on the detection data D1 to D3, the mounting mechanism 66 and the tip portion 66A are aligned at a position corresponding to the un-mounted portion P13. The mounting mechanism 66 and the tip portion 66A press the LED 22 on the element-mounted substrate 2 onto the LED substrate 5 with the resin film 24 in between, thereby re-transferring the LED 22 onto the LED substrate 5. As a result, effects as described above are achieved.

As a result of the deficient portion P11 on the element-mounted substrate 2 at which the LED 22 is not originally disposed being detected before the LED 22 transferring process, the un-mounted portion P13 is indirectly detected. As a result of the mounting defect portion P12 on the element-mounted substrate 2 at which the LED 22 remains without being transferred being detected after the LED 22 transferring process, the un-mounted portion P13 is indirectly detected. Moreover, the un-mounted portion P13 on the mounting substrate 1 (the LED substrate 5) is directly detected after the LED 22 transferring process. As a result, the detection data D1, D2, and D3 are acquired.

The un-mounted portion P13 on the LED substrate 5 may be detected through a combination of two types or more among the three types of methods described above. In the case where two or more types of methods are combined as in the embodiment (three types of methods are combined), detection accuracy of the un-mounted portion P13 is improved.

Moreover, in the case where the LEDs 22 have an outer appearance that is black in color, and regions of the LED substrate 5 other than the LEDs 22 are formed by the BM layer 12, the difference in light transmittance between the mounted portion P10 and the un-mounted portion P13 of LED 22 is able to be increased. As a result, detection accuracy of the detection data D3 is improved.

The present application according to the embodiment is described above. However, the present application is not limited to the embodiment, and various modifications may be made.

For example, in the above-described embodiment, as shown in FIG. 1, the case where the un-mounted portion P13 of LED 22 is indirectly or directly detected by each of three process is described, the three processes being the process for inspecting the element-mounted substrate (before mounting), the process for inspecting the element-mounted substrate (after mounting), and the process for inspecting the mounted substrate. However, the un-mounted portion P13 is not necessarily detected by all three processes. In other words, for example, the un-mounted portion P13 may be detected by only one process or two processes among the three processes.

In the above-described embodiment, the case where the LEDs 22 are pressed with the resin layer 14 in between when transferring the LEDs 22 onto the mounting substrate 1 or re-transferring the LEDs 22 onto the LED substrate 5 (re-paired) is described. However, a layer functioning as described above is not limited to the resin layer. Another layer may be used as long as the layer is formed of a flexible material.

In the embodiment, the LED substrate 5 in which a plurality of LEDs 22 are aligned and disposed on the mounting substrate 1 is given as an example of a light emitting device substrate on which a plurality of light emitting devices are aligned and disposed on a mounting substrate. However, the light emitting device substrate may be formed using light emitting devices other than the LED.

In the embodiment, the light emitting device substrate as described above is given as an example of an electrical component substrate on which a plurality of electrical components are aligned and disposed on a mounting substrate. However, the electrical component substrate may be formed using electronic components other than the light emitting device.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A method of manufacturing an electronic component substrate in which a plurality of electronic components are mounted on a first substrate, the method comprising:

aligning and disposing the plurality of electronic components on a second substrate;

transferring the electronic components on the second substrate onto the first substrate;

detecting an electronic component unmounted portion on the first substrate; and repairing by selectively re-transferring the electronic component from the second substrate onto the detected un-mounted portion on the first substrate.

2. The method of manufacturing an electronic component substrate according to claim 1, wherein repairing step includes:
   disposing the electronic components onto the second substrate with a resin film therebetween;
   disposing the first substrate and the second substrate to face each other such that the electronic components on the first substrate and the electronic components on the second substrate face each other;
   aligning a mounting mechanism at a position corresponding to the un-mounted portion based on detection data of the un-mounted portion; and
   selectively re-transferring the electronic component onto the un-mounted portion by the electronic component on the second substrate being pressed onto the first substrate with the resin film in between by the mounting mechanism.

3. The method of manufacturing an electronic component substrate according to claim 1, wherein, before transferring step, the un-mounted portion is indirectly detected by a deficient portion on the second substrate being detected, the deficient portion being a portion at which the electronic component is not originally disposed.

4. The method of manufacturing an electronic component substrate according to claim 3, wherein the deficient portion on the second substrate is detected by image data being acquired by the electronic components on the second substrate being imaged.

5. The method of manufacturing an electronic component substrate according to claim 3, wherein the deficient portion on the second substrate is detected by displacement data being acquired by displacement on a front surface of the second substrate being inspected.

6. The method of manufacturing an electronic component substrate according to claim 1, wherein, after transferring step, the unmounted portion is detected by a mounting defect portion on the second substrate being detected, the mounting defect portion being a portion at which the electronic component remains without being transferred.

7. The method of manufacturing an electronic component substrate according to claim 6, wherein the mounting defect portion on the second substrate is detected by image data being acquired by the electronic components on the second substrate being imaged.

8. The method of manufacturing an electronic component substrate according to claim 6, wherein the mounting defect portion on the second substrate is detected by displacement data being acquired by displacement on a front surface of the second substrate being inspected.

9. The method of manufacturing an electronic component substrate according to claim 1, wherein, after transferring step, the unmounted portion on the first substrate is directly detected.

10. The method of manufacturing an electronic component substrate according to claim 9, wherein the unmounted portion of the first substrate is directly detected by image data being acquired by the electronic components on the first substrate being imaged.

11. The method of manufacturing an electronic component substrate according to claim 10, wherein the electronic component substrate is a light emitting device substrate formed by the electronic components being configured by light emitting devices having an outer appearance that is black in color, and
   regions of the light emitting device substrate other than the light emitting devices are configured by a black matrix layer.

12. The method of manufacturing an electronic component substrate according to claim 1, wherein the electronic component substrate is a light emitting device substrate formed by the electronic components being configured by light emitting devices.

13. The method of manufacturing an electronic component substrate according to claim 12, wherein the light emitting device substrate is a light emitting diode substrate formed by the light emitting devices being configured by light emitting diodes.

* * * * *